US006369635B2

United States Patent
Weiss et al.

(10) Patent No.: US 6,369,635 B2
(45) Date of Patent: Apr. 9, 2002

(54) TEMPERATURE-COMPENSATED DIODE RECTIFIER CIRCUIT FOR AN HF LEVEL CONTROLLER

(75) Inventors: Manfred Weiss, Rot-Haslach; Martin Fritzmann, Neu-Ulm, both of (DE)

(73) Assignee: Nokia Mobile Phones Ltd. (FI)

( * ) Notice: Subject to any disclaimer, the term of this patent is extended or adjusted under 35 U.S.C. 154(b) by 0 days.

(21) Appl. No.: 09/751,896

(22) Filed: Dec. 28, 2000

(30) Foreign Application Priority Data

Dec. 30, 1999 (DE) .......................................... 199 64 024

(51) Int. Cl.$^7$ ................................................ H03L 5/00
(52) U.S. Cl. ....................... 327/330; 327/513; 455/126; 330/140
(58) Field of Search .............................. 327/58, 62, 61, 327/306, 354, 330, 512, 513; 330/140; 455/115, 126, 127

(56) References Cited

U.S. PATENT DOCUMENTS

| | | | |
|---|---|---|---|
| 5,337,006 A | | 8/1994 | Miyazaki ..................... 330/130 |
| 5,434,537 A | * | 7/1995 | Kukkonen ..................... 330/2 |
| 5,852,770 A | * | 12/1998 | Kasamatsu ................... 455/126 |
| 6,084,920 A | * | 7/2000 | Ferdinandsen ............... 375/297 |
| 6,262,630 B1 | * | 7/2001 | Eriksson ..................... 330/129 |

FOREIGN PATENT DOCUMENTS

EP 0834987 A2 4/1998

* cited by examiner

Primary Examiner—Toan Tran
Assistant Examiner—Quani Tra
(74) Attorney, Agent, or Firm—Perman & Green, LLP

(57) ABSTRACT

A temperature-compensated diode rectifier circuit is coupled to the outside of an HF amplifier (PA) to derive a rectified voltage ($U_D$) from an HF output signal ($RF_{OUT}$) with a rectifier input ($I_R$) via a directional coupler (D-CO) with secondary connections (1, 2), and has a rectifier output ($O_R$) for the rectified voltage ($U_D$), a rectifier diode (D1), a charging capacitor (C1) and a ballast resistor (R2). To stabilize the rectified voltage against temperature influences, the rectifier input ($I_R$) is connected to a d.c. input voltage ($U_{IN}$), and a compensating diode (D2) is in series with the ballast resistor (R2), and a dropping resistor (R1) is in series with the rectifier diode (D1). According to the invention the rectifier diode (D1), the compensating diode (D2), the dropping resistor (R1), the ballast resistor (R2) and the directional coupler (D-CO) are connected to the d.c. input voltage ($U_{IN}$) so that the voltage amplitude of the decoupled HF output signal ($RF_{OUT}$) is added to the d.c. input voltage ($U_{IN}$). Furthermore the dropping resistor (R1) of the rectifier diode (D1) is located between the charging capacitor (C1) and the rectifier output ($O_R$) and the d.c. input voltage ($U_{IN}$) is stabilized and is only slightly higher than twice the threshold voltage ($U_T$) of a diode (D1, D2)

5 Claims, 3 Drawing Sheets

TEMPERATURE-COMPENSATED DIODE RECTIFIER CIRCUIT FOR AN HF LEVEL CONTROLLER

BACKGROUND

The invention concerns a temperature-compensated diode rectifier for an HF level controller, which is located in the gain control loop of an HF amplifier to control the output level of an HF transmitter. The controlled HF amplifier is preferably arranged at the output of a radio telephone modulator. In particular, this is a cellular telephone designed to operate in different transmission bands. The object of the control circuit is to keep the transmitting power of the radio telephone's antenna constant at a set value within a large power range and over a large operating temperature range.

During the telephone operation, radio telephones like cellular telephones adjust their HF transmitting power as a function of the base station density in a radio network and the momentary transmission conditions. After the radio telephone accesses the radio network, the latter assigns a transmission channel to the telephone and continuously monitors the transmission quality. In addition to other HF parameters such as channel frequency and time slot position, the level of the HF transmitting power must be maintained relatively precisely. Rural areas with a low number of simultaneous telephone connections generally have a low base station density despite the advanced development of the radio networks, so that a radio path of up to 40 km to the next base station and poor propagation conditions require the maximum available transmitting power of about 33 dBm (=2 Watt). In contrast thereto, dense population and a high base station density leads to short radio paths which are often only 100 meters long. The transmitting power in such short radio paths can often be reduced to a few dBm/mW to reduce battery load and ensure the transmission quality.

In addition, with high transmitting power and low cell size common channel disturbances can occur in other cells if in accordance with the applicable conventions both cells occupy the same channel. On the other hand, transmitting power which is too low leads to insufficient transmission quality.

It can therefore be seen that on the one hand the control circuit must adjust the HF transmitting power of a cellular telephone as precisely as possible and in a reproducible manner in accordance with the transmission conditions in a large dynamic range, and on the other hand it must maintain the set value in a wide range of operating temperatures. These requirements are difficult to fulfill with low HF transmitting power.

According to the present state of development, the transmitting power including power losses in the cellular telephone, for example in the transmitting/receiving switch, must be adjustable for a 900 MHz frequency band in a range of levels between 5 dBm and 39 dBm, and for the frequency bands of 1800 MHz and 1900 MHz in a range between 0 dBm and 36 dBm. These settings should have an accuracy of ±0.5 dBm in the temperature range of −20° C. to +60° C.

The present invention starts with a temperature-compensated diode rectifier circuit according to application EP 0 834 987 A2. To better understand the problem, differences between the known solution and the present invention are explained by means of FIG. 1.

An HF amplifier PA is located between the modulator output of a not illustrated telephone module and an antenna circuit A, to amplify a transmission signal $RF_{IN}$ which in this case is digitally modulated to 900 MHz on a carrier. To obtain an HF output signal $RF_{OUT}$ for the antenna circuit A at a defined power level in the above cited level range, a control loop with a comparator COM which compares the known desired value to the actual value, adjusts the amplification of the HF amplifier PA. The comparator COM compares a d.c. control voltage $U_{CTR}$, which corresponds to the desired power level, with a rectified voltage $U_D$ whose level depends on the power level of the HF output signal $RF_{OUT}$. A rectifier circuit with a rectifier diode D1, a charging capacitor C1 and a ballast resistor R2 obtains the rectified voltage $U_D$ from the output signal $RF_{OUT}$ of the antenna circuit. A directional coupler D-CO connects the rectifier circuit to the antenna circuit.

The voltage of the HF output signal $RF_{OUT}$ in the cited level range varies by more than the ratio n=1:30. This requires a linear conducting characteristic of the rectifier diode and a steep transition from the off mode to the conducting mode, in order to obtain a small setting deviation even at low levels. This is made more difficult because in extreme cases only a minimum 3 V operating voltage is available for a cellular telephone. Since the comparator COM can only compare voltages which are below its own operating voltage, the directional coupler D-CO and the rectifier circuit must be designed so that even at a maximum power level the rectified voltage $U_D$ is still at least slightly under this value. The result is that even with an ideal characteristic diode curve, the part of the rectified output signal $Û_{RF}$ at the lowest power level in the rectified voltage $U_D$ would be under 100 mV.

The transition from the off mode to the conducting mode in rectifier diodes lies outside of the axial zero point. Without special measures only one rectified voltage $U_D$ reaches the output when the amplitude of the decoupled output signal is above a threshold voltage $U_T$. For that reason the diode D1 operates advantageously with a bias voltage, or like the solution of application EP 0 834 987 A2 with a bias current. The threshold voltage $U_T$ depends on the operating temperature and in Schottky diodes for example it is in the desired temperature range under $U_T$=300 mV.

The power level at the output of the HF amplifier PA must be independent of operating temperature changes. However this is not so in conventional rectifier circuits. Conventional diodes with small forward currents have a temperature dependence of about 2.0 mV/° C. Thus a permissible 80° C. temperature change requires a change of 160 mV in the rectified voltage $U_D$. This is larger than the part of rectified the output signal $Û_{RF}$ in the voltage.

To compensate the temperature run of the rectified voltage $U_R$, it is known from application EP 0 834 987 A2 to place a compensating diode D2 in series with the ballast resistor R2, and to connect one side of the rectifier diode D1 to the battery voltage $U_{BAT}$ via a ballast resistor R1. This creates a voltage divider for the battery voltage $U_{BAT}$ with a series circuit of a diode D1 or D2 and a resistor R1 or R2 in each dividing branch, and the rectifier output $O_R$ has the rectified voltage $U_D=U_{DO}+Û_{RF}$ which contains a bias component $U_{DO}=U_T+Û_{R2}$. With a bias current $I_{BIAS}$ between 20 μA and 200 μA, the battery voltage $Û_{BAT}$ places both diodes D1, D2 in the conductive condition. Due to the temperature dependence of diodes D1 and D2, the bias current $I_{BIAS}$ is also temperature dependent. However since equal diode types and thermally coupled diodes D1, D2 have the same temperature dependence in each dividing branch, the division ratio of the voltage divider remains stable insofar as the dropping resistor R1 and the ballast resistor R2 have the same value and the comparator COM has a high input resistance. In this case the bias component $U_{DO}=1/2\ U_{BAT}$ and only depends on the battery voltage $U_{BAT}$ level. The rectified voltage $U_M$ can therefore only vary between full and half the operating voltage value. In practice this reduces the variation range of the rectified output signal $\hat{U}_{RF}$ in the rectified voltage $U_D$ to 1.5 Volts. However if the resistors R1 and R2 are different, for example to expand the variation range of the rectified voltage $U_D$, the rectifier circuit has a defined temperature run. The ratio of the resistors to each other can be used to establish a positive or a negative temperature run. The decoupled output signal goes from the directional coupler D-CO via a coupling capacitor C2 to a summation point S in the rectifier circuit where it is superimposed on the bias current $I_{BIAS}$. The resistor RE is used to adapt the directional coupler D-CO and terminate the wave impedance.

The bias component $U_{DO}$ is always at a fixed ratio with the battery voltage $U_{BAT}$, which can fluctuate broadly in a radio telephone. For that reason the level of the d.c. control voltage $U_{CTR}$ must also be coupled to the changing battery voltage $U_{BAT}$.

In addition to the cited disadvantages, it was also shown in practice that at small power levels up to about 10 dBm the known rectifier circuit only produces a rectified output signal $\hat{U}_{RF}$ of a few millivolts at the rectifier output, so that the control circuit operation at the lower level of the HF output signal $RF_{OUT}$ is insufficient. The cause of this deficiency is apparently the linkage of the bias current $I_{BIAS}$ with the decoupled part of the output signal $RF_{OUT}$ at the summation point S. By comparison with the resistors R1 and R2, the diodes D1 and D2 only have a small impedance. This means that the resistors R1 and R2 act as a current source with respect to the diodes and provide a relatively stable bias current $I_{BIAS}$ above the transition from the off mode to the conducting mode, so that the amplitude of the decoupled HF output signal $RF_{OUT}$ has to exceed a minimum power value to compensate this current and with the diode D1 achieve a rectified voltage that depends on the HF output signal $RF_{OUT}$. Until the bias current $I_{BIAS}$ is compensated, the diodes D1, D2 have a small impedance and the capacitors C1 and C2 form an a.c. voltage divider which divides the decoupled HF output signal $RF_{OUT}$ accordingly. This means that instead of the rectified output signal $\hat{U}_{RF}$, at a low level only a component of the a.c. voltage takes place in the rectified voltage $U_D$. Thus the bias current in the known circuit first realizes the above described temperature compensation, but provides insufficient bias to the diodes D1, D2 with the threshold voltage $U_T$.

SUMMARY

Starting with the cited deficiencies of the known solution, it is the object of the invention to create a rectifier circuit in a control circuit for regulating the level of an HF output signal in an antenna circuit, which by comparison with the known solutions also has sufficient sensitivity at a low HF output level in addition to good temperature compensation. Beyond that the rectifier circuit must also work with devices designed to operate in different frequency bands, in so-called dual band mobile phones.

To achieve this object the invention starts with a rectifier circuit containing a rectifier input for the HF output signal which is decoupled from the antenna circuit, and a rectifier output for a rectified voltage. To measure the level of the HF output signal, the circuit is coupled to the rectifier input via a directional coupler in the antenna circuit. The rectifier circuit contains a rectifier diode, a charging capacitor and a ballast resistor which leads from the rectifier output to a ground connection of the circuit. The rectifier input is connected to a d.c. input voltage to stabilize the rectified voltage against temperature influences. Furthermore a compensating diode is placed in series with the ballast resistor, and a dropping resistor in series with the rectifier diode. A voltage divider, in which each dividing branch contains a resistor and a diode that is polarized in the flow direction, leads from the d.c. input voltage to the rectifier output, so that the rectified voltage is independent of the temperature and preferably contains a bias component at half the level of the d.c. input voltage.

In contrast to the known solution however, the components of the rectifier circuit and the directional coupler of the invention are connected to the d.c. input voltage so that the voltage amplitude of the decoupled HF output signal is added to the d.c. input voltage, and the dropping resistor of the rectifier diode is located between the charging capacitor and the rectifier output.

Another measure for achieving the object of the invention is that the d.c. input voltage is stabilized and is only slightly higher than twice the threshold voltage of a diode.

The addition of the HF output signal is achieved in that on one side the connections of the directional coupler are directly connected to the d.c. input voltage, and on the other side directly to the rectifier input, so that the inductively decoupled HF a.c. voltage is in series with the d.c. input voltage.

This has the advantage that on the one hand the decoupled HF a.c. voltage at the rectifier input is directly superimposed on the d.c. input voltage, and works against it when the amplitude of the HF output signal is negative, while no signal current flows. On the other hand the rectified part of the output signal in the rectified voltage at the charging capacitor is nearly twice as large as the rectifier output. With a small HF output level, the cited measures allow better use of the current-voltage dependence of the rectifier diode during the transition from the off mode to the conducting mode. The small d.c. input voltage enables to almost double the variation range of the rectified voltage and thereby also a corresponding increase in the HF a.c. voltage at the rectifier input, without the maximum rectified voltage exceeding an unallowable high value at the rectifier output. The position of the dropping resistor also enables a further doubling of the HF a.c. voltage at the rectifier input, without the rectified voltage exceeding the unallowable high value or changing the temperature run. Furthermore, since no fixed bias current is fed to the rectifier diode, no output power is needed to compensate when signal amplitudes are negative.

As a result and compared to the known solution, the diode rectifier circuit of the invention provides sufficient sensitivity with equally good temperature compensation in an HF output level range which is expanded downward by about 10 dBm. This diode rectifier circuit also allows a control circuit of the HF transmitter to control output levels in the 0 dBm to 10 dBm range with sufficient accuracy.

BRIEF DESCRIPTION OF THE DRAWINGS

The invention is explained in the following by means of an embodiment. The corresponding figures show.

DETAILED DESCRIPTION

Figure 1:
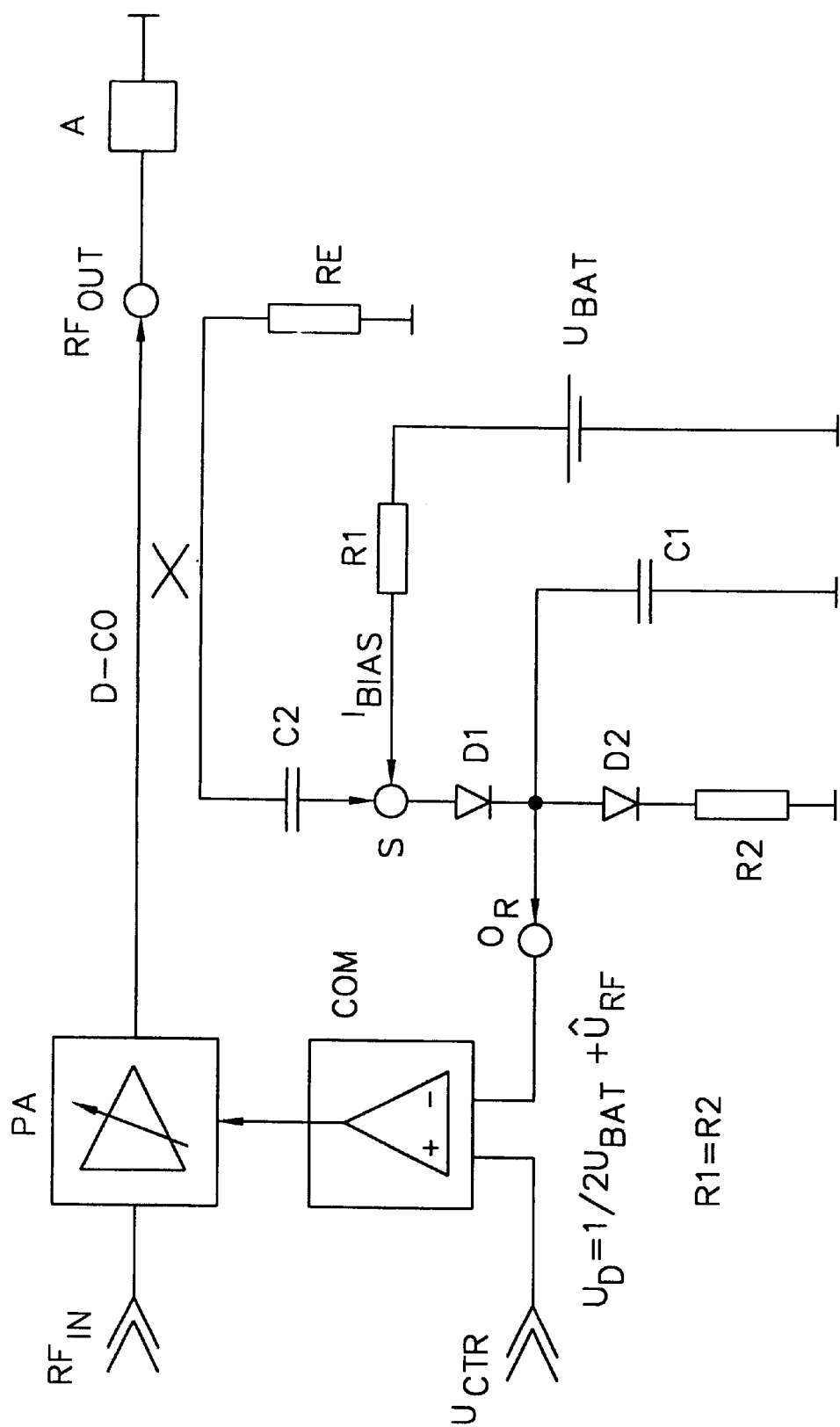
FIG. 1 a control circuit for an HF level control with a known temperature-compensated diode rectifier circuit FIG. 2 a control circuit for an HF level control with a temperature-compensated diode rectifier circuit of the invention.

The control circuit shown in FIG. 1 contains the temperature-compensated diode rectifier circuit from document EP 0 834 987 A1 which comes closest to the solution of the invention and is described in the introduction of that document.

Figure 2:
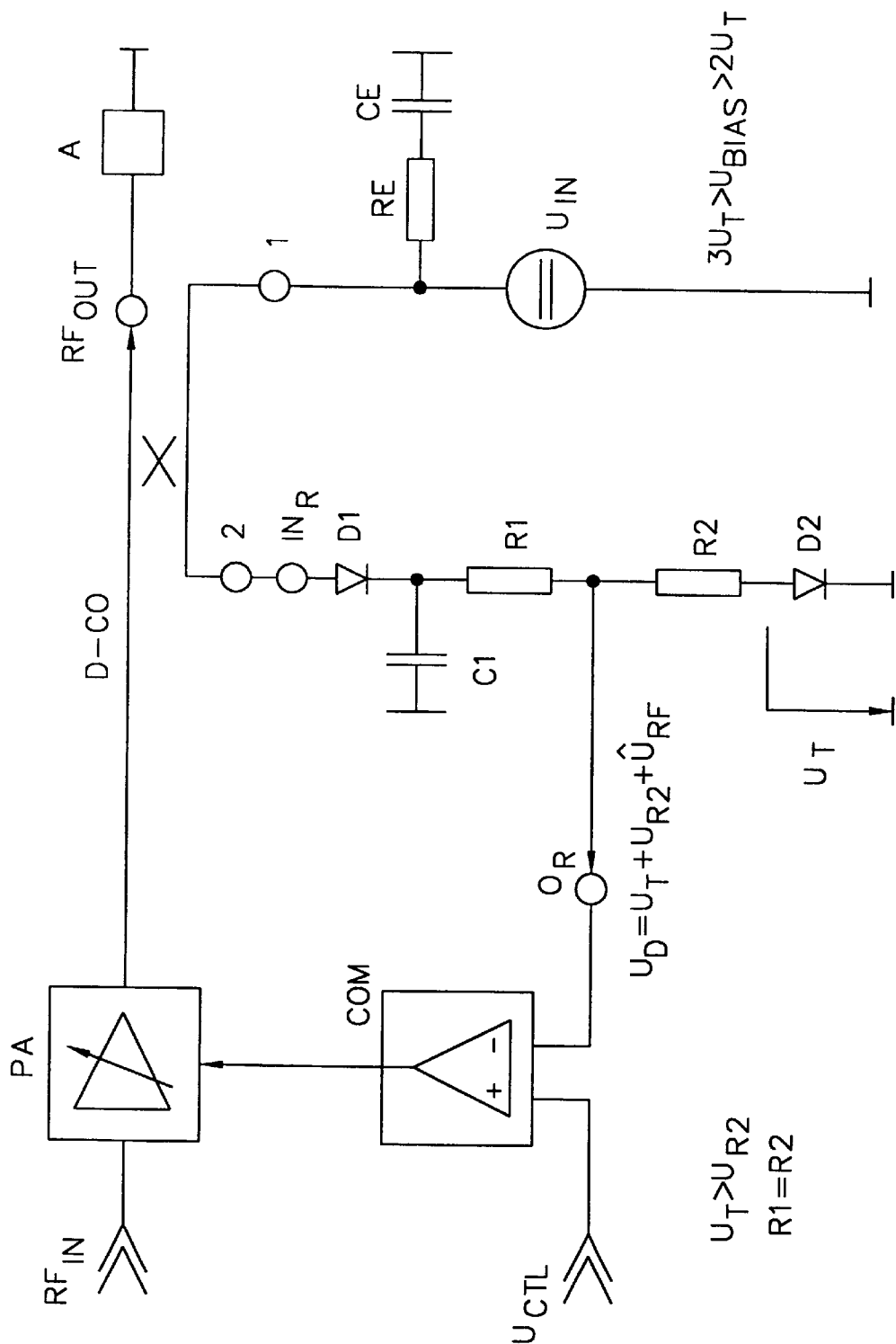

FIG. 2 shows the known control circuit with a diode rectifier circuit according to the invention for deriving a rectified voltage $U_D$ from an HF output signal $RF_{OUT}$ for an antenna circuit A. It is also coupled to an antenna circuit through a rectifier input $IN_R$ via a directional coupler D-CO. An HF amplifier PA whose amplification can be controlled by a comparator COM supplies the antenna circuit A with an HF output signal $RF_{OUT}$ which must have a controllable but constant HF level. The antenna circuit A essentially contains a transmitting-receiving antenna and the respective antenna change-over switch for the two-way operation of the antenna with a transmitting and a receiving module. The rectifier circuit contains a rectifier diode D1, a charging capacitor C1 and a ballast resistor R2, and supplies the rectified voltage $U_D$ at a rectifier output $O_R$. To stabilize the rectified voltage against temperature influences within an allowable temperature range, the rectifier input $IN_R$ is connected to a d.c. input voltage $U_{IN}$ via the directional coupler D-CO. In contrast to the known solution however, the voltage is stabilized and is only slightly higher than twice the threshold voltage $U_T$ of a diode D1, D2. Also for temperature compensation there is a compensating diode D2 in series with the ballast resistor R2, and a rectifier diode D1 in series with a dropping resistor R1. However the dropping resistor R1 on the one hand is connected to the rectifier diode D1 and the charging capacitor C1, and on the other to the rectifier output $O_R$. This divides the rectified voltage of the charging capacitor C1 by a division factor k, which is slightly greater than 0.5 due to the threshold voltage $U_T$ of diode D2. Here the directional coupler D-CO can be designed so that the amplitude of the decoupled HF output signal $RF_{OUT}$ at the rectifier input $IN_R$ is accordingly larger than with the known solution. This already allows the rectifier diode D1 to go from the off mode into the conducting mode at smaller HF levels, without exceeding the maximum allowable rectified voltage $U_{DMAX}=U_{BAT}$ for the comparator COM at the maximum HF level. If the dropping resistor R1 and the ballast resistor R2 have the same value, the division factor of the voltage divider D1, D2, R1, R2 remains independent of the operating temperature, in the same way as with the known solution. Since the d.c. input voltage $U_{IN}$ is stabilized, the rectified voltage $U_D$ remains free of changes which depend on the load condition of the instrument battery.

The directional coupler has a secondary connection 1 which is directly connected to the d.c. input voltage, and a secondary connection 2 which is connected to the rectifier input $IN_R$, so that the inductively decoupled HF alternating voltage and the d.c. input voltage $U_{IN}$ are in series.

The rectifier circuit is particularly sensitive when the d.c. input voltage $U_{IN}$ is a few hundredths of a volt higher than twice the threshold voltage $U_T$, which the diodes D1, D2 exhibit at the lowest operating temperature of the allowable range. At this operating temperature the threshold voltage $U_T$ of diodes D1, D2 is the highest and the bias current $I_{BMIN}$ through the voltage divider D1, D2, R1, R2 is the lowest. On the one hand the dropping resistor R1 and the ballast resistor R2 must be designed with reference to the d.c. input voltage $U_{IN}$ and the d.c. input current of comparator COM, so that the bias current $I_{BMIN}$, which flows into the voltage divider D1, D2, R1, R2, is still higher than the d.c. input current of comparator COM, and on the other hand that the voltage decrease caused by the bias current $I_{BMIN}$ at the dropping resistor R1 is lower than the threshold voltage $U_T$ of diodes D1, D2. In this way even at the lowest operating temperature in the allowed usage range, and with very low bias current $I_{BMIN}$ at the rectifier input $IN_R$, the bias component in the rectified voltage $U_D$ is still nearly half as large as the d.c. input voltage $U_{IN}$. At higher operating temperatures the threshold voltage $U_T$ of diodes D1, D2 drops, the bias current through the voltage divider D1, D2, R1, R2 increases and causes correspondingly higher voltage drops in the resistors.

Figure 3:
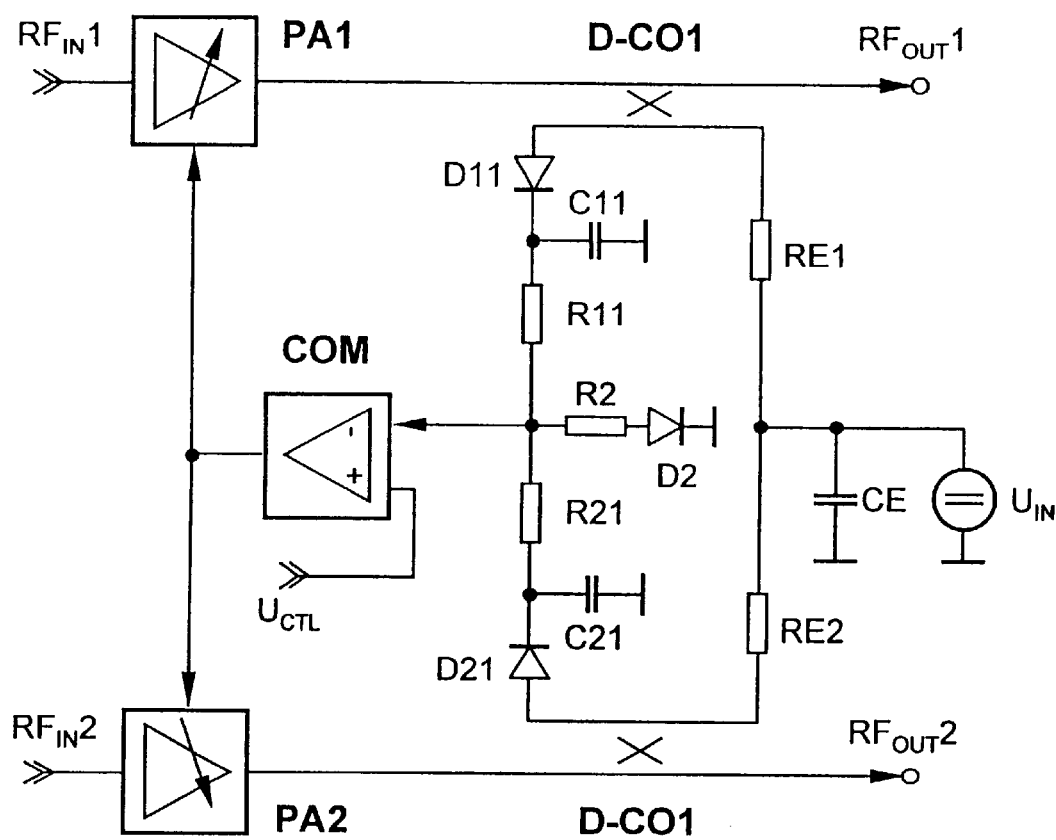
FIG. 3 another embodiment of the invention for use in a device which operates in several frequency bands.

FIG. 3 shows a special configuration of the invention for use in a device that operates in different frequency bands, for example for a transmission signal $RF_{IN}1$ in a 900 MHz frequency band, and a transmission signal $RF_{IN}2$ in an 1800 MHz frequency band. The circuit has a controllable power amplifier PA1 and PA2 for each frequency band, which are switched to the corresponding modulator outputs of a telephone module by not illustrated switches. In addition each frequency band has its own diode rectifier with a diode D11 or D12 (sic), a charging capacitor C11 or C21 and a ballast resistor R11 or R21. However the comparator COM and the ballast resistor R2 with a compensating diode D2 are used together. The transfer ratio of each directional coupler D-CO1 and D-CO2 is designed so that for each frequency band the variable range of the rectified output signal $Û_{RF}$ in the rectified voltage $U_D$ is fully utilized. Since a bias current $I_{BIAS}$ flows via each rectifier diode D11, D21 to the ballast resistor R2 and to the compensating diode D2, the value of the ballast resistor should be R2=1/2R11=1/2R21 in order to achieve an optimum temperature compensation. Due to the double bias current $I_{BIAS}$ flowing through the compensating diode D2, the voltage drop in the diode increases by a few hundredths of a volt, but the temperature behavior remains unchanged by comparison with the rectifier diodes D11, D21. Each directional coupler D-CO1 and D-CO2 is closed off from the HF signal by a terminal resistor RE1, RE2. This achieves the optimum directional effect for each coupler. The bases of the terminal resistors are held to the stabilized d.c. voltage potential with the help of capacitor CE.

What is claimed is:

1. A temperature-compensated diode rectifier circuit which is coupled to the outside of an HF amplifier (PA) to derive a rectified voltage ($U_D$) from an HF output signal ($RF_{OUT}$) with a rectifier input ($I_R$) via a directional coupler (D-CO) with secondary connections (1, 2), it comprises a rectifier output ($O_R$) for the rectified voltage ($U_D$), a rectifier diode (D1), a charging capacitor (C1) and a ballast resistor (R2), and is connected to a d.c. input voltage ($U_{IN}$) via the rectifier input ($I_R$), to stabilize the rectified voltage against temperature influences in an allowable usage range, and contains a compensating diode (D2) in series with the ballast resistor (R2), and a dropping resistor (R1) in series with the rectifier diode (D1), characterized in that the rectifier diode (D1), the compensating diode (D2), the dropping resistor (R1), the ballast resistor (R2) and the directional coupler (D-CO) are connected to the d.c. input voltage ($U_{IN}$) so that the voltage amplitude of the decoupled HF output signal ($RF_{OUT}$) is added to the d.c. input voltage ($U_{IN}$), that the dropping resistor (R1) of the rectifier diode (D1) is located between the charging capacitor (C1) and the rectifier output ($O_R$), and that the d.c. input voltage ($U_{IN}$) is stabilized and is only slightly higher than twice the threshold voltage ($U_T$) of the diode (D1, D2).

2. A diode rectifier circuit as claimed in claim 1, characterized in that a secondary connection (1) of the directional coupler (D-CO) is directly connected to the d.c. input voltage ($U_{IN}$), and the other connection directly to the rectifier input ($IN_R$), so that the HF alternating voltage which is inductively decoupled by the directional coupler (D-CO) is in series with the d.c. input voltage ($U_{IN}$).

3. A diode rectifier circuit as claimed in claim 1, characterized in that the d.c. input voltage ($U_{IN}$) is a few hundredths of a volt above twice the threshold voltage ($U_T$), which the diodes (D1, D2) exhibit at the minimum operating temperature in the allowed range.

4. A diode rectifier circuit as claimed in claim 3, characterized in that the d.c. input voltage ($U_{IN}$) is between two and three times the value of the threshold voltage ($U_T$) of the diode (D1, D2).

5. A diode rectifier circuit as claimed in claim 1, characterized in that the circuit with the double diode rectifier (D11, D21, C11, C21, R11, R21), but with a common compensating diode (D2) is used in a mobile telephone which is designed to operate in different frequency bands.

* * * * *